US010819374B2

(12) United States Patent
Ruano et al.

(10) Patent No.: US 10,819,374 B2
(45) Date of Patent: Oct. 27, 2020

(54) ACCELERATED PROCESSING FOR MAXIMUM DISTANCE SEPARABLE CODES USING COMPOSITE FIELD EXTENSIONS

(71) Applicant: Aalborg Universitet, Aalborg (DK)

(72) Inventors: Diego Ruano, Valladolid (ES); Daniel E. Lucani, Aalborg øst (DK); Olav Geil, Aalborg (DK)

(73) Assignee: AALBORG UNIVERSITET, Aalborg (DK)

(*) Notice: Subject to any disclaimer, the term of this patent is extended or adjusted under 35 U.S.C. 154(b) by 25 days.

(21) Appl. No.: 16/153,066

(22) Filed: Oct. 5, 2018

(65) Prior Publication Data

US 2019/0109603 A1    Apr. 11, 2019

Related U.S. Application Data

(60) Provisional application No. 62/568,555, filed on Oct. 5, 2017.

(51) Int. Cl.
| | |
|---|---|
| *H03M 13/00* | (2006.01) |
| *H03M 13/37* | (2006.01) |
| *G06F 17/16* | (2006.01) |
| *G06F 9/30* | (2018.01) |

(Continued)

(52) U.S. Cl.
CPC ......... *H03M 13/373* (2013.01); *G06F 7/724* (2013.01); *G06F 9/30036* (2013.01); *G06F 17/16* (2013.01); *H03M 13/151* (2013.01); *H03M 13/1515* (2013.01)

(58) Field of Classification Search
CPC ............ H03M 13/151; H03M 13/373; H03M 13/1515; H03M 13/158; H03M 13/3761; H03M 13/617; H03M 13/033; H03M 13/15; H03M 13/1102; G06F 9/30036; G06F 7/724; G06F 17/16
See application file for complete search history.

(56) References Cited

U.S. PATENT DOCUMENTS

2015/0095747 A1* 4/2015 Tamo .................. H03M 13/151
                                                                    714/781

OTHER PUBLICATIONS

Burihabwa, et al.; "A Performance Evaluation of Erasure Coding Libraries for Cloud-Based Data Stores;" IFIP—2016; Springer; Jun. 6-9, 2016; 14 pages.

(Continued)

*Primary Examiner* — Guerrier Merant
(74) *Attorney, Agent, or Firm* — Daly, Crowley, Mofford & Durkee, LLP

(57) ABSTRACT

Disclosed apparatus and method improve the computational efficiency of encoding and decoding data having erasures according to a maximum distance separable (MDS) code based on a Reed-Solomon code. Thus, n encoded fragments are formed by multiplying k data fragments by an n×k generator matrix for the MDS code. The code is formed by reducing, in the generator matrix to the extent possible, the size of the finite field to which entries belong—in some cases to the base field having only two elements. In this way, unlike codes known in the art, the generator matrix has more than one column whose entries each take values in the finite field having two elements. In some cases, the generator matrix has a column whose entries each take values in one or more intermediate fields between the finite field having two elements and the encoding field.

15 Claims, 4 Drawing Sheets

(51) Int. Cl.
*H03M 13/15* (2006.01)
*G06F 7/72* (2006.01)

(56) References Cited

OTHER PUBLICATIONS

Delsarte; "On Subfield Subcodes of Modified Reed-Solomon Codes;" IEEE Transactions Information Theory; vol. IT-21; No. 5: Jan. 1975; 2 pages.

Hernando, et al.; "Subfield-Subcodes of Generalized Toric Codes;" 2010 IEEE International Symposium on Information Theory; Jun. 2010; 5 pages.

Heide, et al.; "Composite Extension Finite Fields for Low Overhead Network Coding: Telescopic Codes;" 2015 IEEE International Conference on Communications (ICC); Jun. 2015; 6 pages.

McWilliams, et al.; "The Theory of Error-Correcting Codes;" North-Holland Publishing Company; Amsterdam-New York-Oxford, 1977; North-Holland Mathematical Library; vol. 16; Jan. 1977; (1 of 3—250 pages).

McWilliams, et al.; "The Theory of Error-Correcting Codes;" North-Holland Publishing Company; Amsterdam-New York-Oxford, 1977; North-Holland Mathematical Library; vol. 16; Jan. 1977; (2 of 3—300 pages).

McWilliams, et al.; "The Theory of Error-Correcting Codes:" North-Holland Publishing Company; Amsterdam-New York-Oxford, 1977; North-Holland Mathematical Library; vol. 16; Jan. 1977; (3 of 3—221 pages).

Sorensen, et al.; "Leaner and Meaner: Network Coding in SIMD Enabled Commercial Devices;" IEEE Wireless Communications and Networking Conference (WCNC 2016); Apr. 2016; 6 pages.

Ding, et al.; "Maximum Distance Separable Codes for b-Symbol Read Channels;" Finite Fields and Their Applications; vol. 49; Issue C; Jan. 2018; 16 pages.

Pedersen, et al.; "Kodo: An Open and Research Oriented Network Coding Library;" Springer Berlin Heidelberg; 2011; Online: http://dx.doi.org/10.1007/978-3-642-23041-7_15; Jan. 2011; 8 pages.

Plank, at al.; "A Performance Evaluation and Examination of Open-Source Erasure Coding Libraries for Storage;" FAST-2009: 7th Usenix Conference on File and Storage Technologies; Feb. 2000; 13 pages.

Plank, at al.; "Screaming Fast Galois Field Arithmetic Using Intel SIMD Instructions;" FAST-2013; 11th Usenix Conference on File and Storage Technologies; Feb. 2013; 8 pages.

Reed, et al.; "Polynomial Codes Over Certain Finite Fields;" Journal of the Society for Industrial and Applied Mathematics; vol. 8; No. 2; Jun. 1960; 2 pages.

\* cited by examiner

ACCELERATED PROCESSING FOR MAXIMUM DISTANCE SEPARABLE CODES USING COMPOSITE FIELD EXTENSIONS

CROSS-REFERENCE TO RELATED APPLICATION

This application claims the benefit of U.S. Provisional Application 62/568,555, filed Oct. 5, 2017 and naming the same inventors, the entire contents of which are incorporated herein by reference.

FIELD

The disclosure pertains generally to coding, decoding, or code conversion for error detection or error correction, and more particularly to encoders and decoders using a maximum distance separable (MDS) code.

BACKGROUND

FIG. 1 schematically shows a Reed-Solomon (RS) encoder 10 known in the art. The encoder 10 receives data from a data producer and encodes them for output to a data channel. Data input from the data producer are stored in a data input buffer 12 as k data symbols. A data symbol may be a single bit (i.e. having a value of 0 or 1), but in general is an element of a finite field having q elements. Finite fields are known to have $q=p^s$ elements where p is a prime number and s is an integer; typically $p=2$ so that elements of the field have an s-bit representation suitable for computation. The data symbols are presented to encoding circuitry 14 for encoding. The encoding circuitry 14 multiplies the k data symbols by an n×k generator matrix 16 to produce n encoded symbols that are stored in an output buffer 18 before ultimately being transmitted to the data channel. Typically $k<n\leq q$ so that the encoded symbols include redundant data that may be used to detect and/or correct errors or erasures.

FIG. 2 schematically shows a corresponding Reed-Solomon decoder 20 known in the art. The decoder 20 receives encoded symbols from the data channel and decodes them for output as decoded data to a data consumer. The encoded data from the data channel are stored in an input buffer 22 as encoded symbols. In many cases, the encoded symbols contain errors or erasures, whether introduced by an intermediary data storage or manipulation device or the data channel itself. The encoded symbols (with or without errors or erasures) are presented to decoding circuitry 24 for conversion back to the original data symbols.

The decoding circuitry 24 may correct errors, in accordance with one optional technique known in the art, by multiplying the n encoded symbols by a k×n decoder matrix 26 (e.g. the pseudo-inverse of the n×k generator matrix 16), or a k×k submatrix thereof, to produce k data symbols. If the input contained errors, then the resultant data symbols contain those errors as "syndromes" known in the art. The decoding circuitry 24 may analyze these syndromes to determine the number of errors, their positions in the received codeword, and the error symbols at those positions, then subtract the error symbols to obtain an error-free data word. The error-free data word has k data symbols, and is stored in a data output buffer 28 before ultimately being transmitted to the data consumer. Alternately or in addition, the decoding circuitry 24 may correct erasures in reception (that is, receiving in the input buffer less than all n of the encoded symbols) by performing Gaussian elimination on the received encoded symbols.

Encoders and decoders such as those described in connection with FIGS. 1 and 2 may be implemented using various hardware. The data channels may be data buses, or other wired or wireless data communication systems. The input and output buffers 12, 18, 22, and 28 may be implemented using volatile memories such as registers. The encoding circuitry 14 and decoding circuitry 24 may be implemented, for example, by a computer processor or similar circuitry. The generator matrix 16 and decoder matrix 26 may be implemented by storing particular data in a volatile or non-volatile memory. It is appreciated that other hardware may be used to implement encoders and decoders. It is also appreciated that the data producer or data consumer itself may be an encoder or decoder as described above, or a data transcoder, or in general another data channel.

Reed-Solomon codes were proposed for the first time in 1960 as a class of error-correcting codes. Since then, RS codes have been used in a large number of applications from data communication to distributed storage both as an error-correcting code or as an erasure-correcting code and relying on several constructions for RS code generator matrices, e.g., Vandermonde and Cauchy matrices. Although popular, these designs have remained relatively unchanged in the last decades and are typically associated with significant computational costs for encoding (respectively decoding) as the number of symbols (k) increases due to the finite field operation costs and the order $O(k^2)$ (respectively $O(k^3)$) scaling. Recent proposals focused on improving the overall scaling of encoders/encoders to $O(k \log (k))$ by using constructions based on the Fast Fourier Transform (FFT). However, their performance for moderate k, e.g., for communications and storage, is yet to be studied.

Given the growing challenges and upcoming demands in communication and distributed storage systems, the development of efficient constructions of RS codes that can (i) seamlessly replace older constructions without modifying the system's operation, and (ii) deliver higher encoding and decoding speeds, becomes increasingly relevant. In the context of older CPUs, Cauchy matrices are known to be faster than Vandermonde matrices. However, the use of hardware acceleration, e.g., single instruction, multiple data (SIMD) operations, in Intel and ARM CPUs has made both approaches faster and reduced the gap between them, making them essentially equivalent in processing performance for the same implementation. Thus, novel solutions that radically redefine the core operations of the finite fields and exploit them are needed to provide the critical speed-ups.

SUMMARY OF DISCLOSED EMBODIMENTS

Disclosed embodiments reduce computational costs in practical systems via a new design for Maximum Distance Separable (MDS) codes, based on Reed-Solomon codes. To achieve this design, we use the facts that (i) finite fields of the form $\mathbb{F}_{2^s}$ for some s can be computed faster for smaller s, and that (ii) it is possible to generate efficient composite extension fields that maintain compatibility in their operations (i.e., products in a smaller field have a direct bit-by-bit mapping to the same products performed in a larger field constructed from that smaller field).

Disclosed embodiments use composite extension finite fields and a deterministic algorithm. The algorithm first maximizes the number of columns in the generator matrix that are composed solely by the smallest finite field. Next, it maximizes the number of columns with the second smallest finite field (an intermediate finite field). The algorithm continues until columns can only be of the largest finite field allowed. Performance gains of as much as two-fold in SIMD capable CPUs obtain for decoding, while using the same decoding algorithm (Gaussian Elimination) as a Vandermonde RS code. Higher gains are expected in devices not capable of SIMD instructions and/or by using a decoding algorithm other than Gaussian Elimination.

Thus, a first embodiment is an apparatus for decoding data according to a maximum distance separable (MDS) code defined over an encoding field having $2^s>2$ elements. The apparatus has an input buffer configured for receiving a plurality of encoded fragments. The encoded fragments were formed, prior to their receipt by the apparatus, by multiplying a plurality of k data fragments by an n×k generator matrix for the MDS code. Each data fragment and the generator matrix comprise data symbols in the encoding field. The generator matrix has a plurality of columns whose entries each take values in the finite field having two elements. The apparatus also has decoding circuitry configured for decoding any k received encoded fragments as the k data fragments. The apparatus further has an output buffer configured for storing the k data fragments following decoding.

Some embodiments include a storage arrangement configured for storing the plurality of encoded fragments. The input buffer may be configured for receiving, from the storage arrangement, less than all of the plurality of the encoded fragments due to an erasure in the storage arrangement. The storage arrangement may have a plurality of storage devices, and be configured for storing at least two encoded fragments on different storage devices.

In some embodiments, the decoding circuitry is configured for performing Gaussian elimination on the received encoded fragments.

In some embodiments, the decoding circuitry comprises a computer processor. The computer processor may lack circuitry for performing single instruction, multiple data (SIMD) operations.

In some embodiments, the generator matrix has a column whose entries each take values in an intermediate field between the finite field having two elements and the encoding field. The generator matrix also may have a column whose entries each take values in a second intermediate field between the intermediate field and the encoding field.

A further embodiment is a method of decoding data according to a maximum distance separable (MDS) code defined over an encoding field having $2^s>2$ elements. The method includes receiving, in an input buffer, a plurality of encoded fragments. The encoded fragments were formed, prior to their receipt, by multiplying a plurality of k data fragments by an n×k generator matrix for the MDS code. Each data fragment and the generator matrix comprise data symbols in the encoding field. The generator matrix has a plurality of columns whose entries each take values in the finite field having two elements. The method also includes decoding, by decoding circuitry, any k received encoded fragments as the k data fragments. The method further includes storing, by an output buffer, the k data fragments following decoding.

In some embodiments, receiving comprises receiving, from a storage arrangement, less than all of the plurality of the encoded fragments due to an erasure in the storage arrangement.

In some embodiments, decoding comprises performing Gaussian elimination on the received encoded fragments.

In some embodiments, decoding comprises decoding without using single instruction, multiple data (SIMD) operations.

In some embodiments, the generator matrix has a column whose entries each take values in an intermediate field between the finite field having two elements and the encoding field. The generator matrix also may have a column whose entries each take values in a second intermediate field between the intermediate field and the encoding field.

It is appreciated a person having ordinary skill in the art may contemplate other ways to embody the concepts, structures, and techniques disclosed herein.

DESCRIPTION OF THE SEVERAL VIEWS OF THE DRAWINGS

The manner and process of making and using the disclosed embodiments may be appreciated by reference to the drawings, in which.

DETAILED DESCRIPTION

Figure 1:
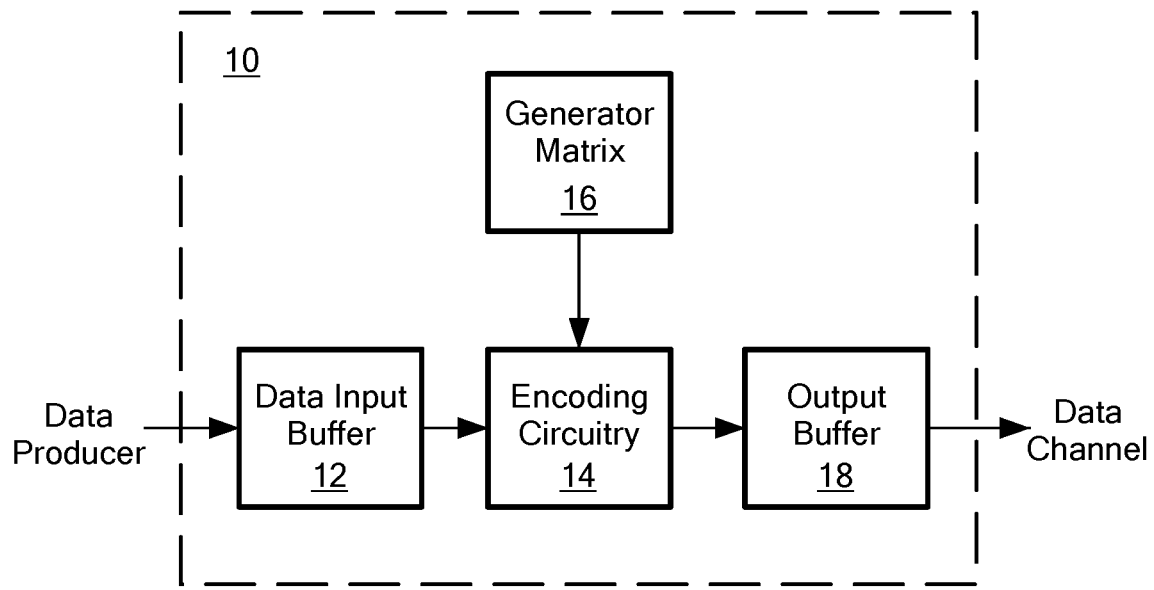
FIG. 1 schematically shows a Reed-Solomon encoder.
Figure 2:
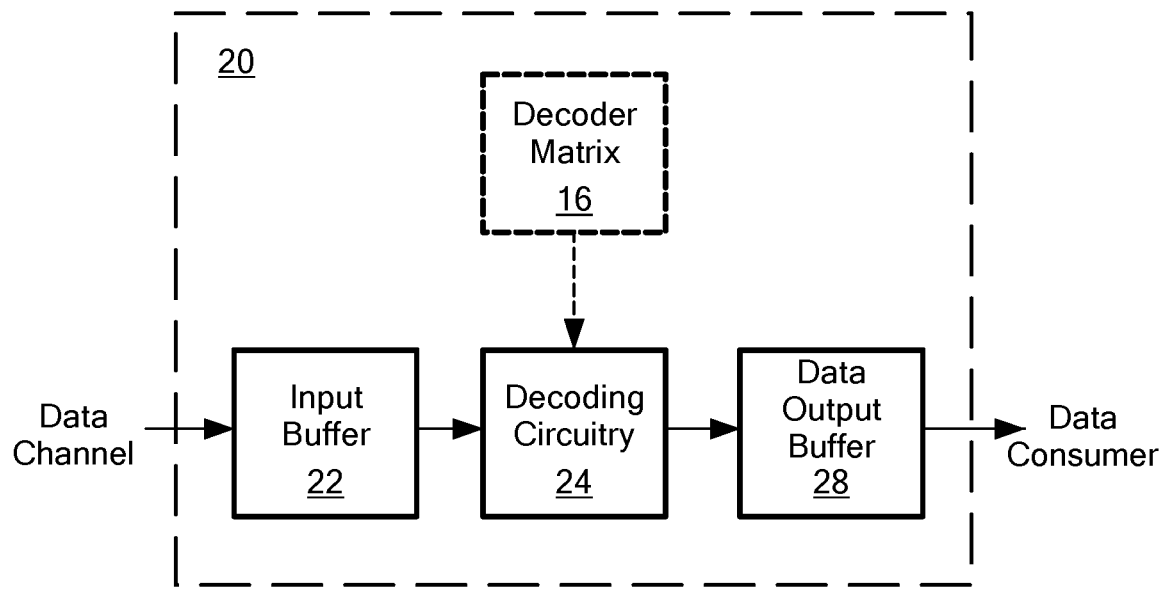
FIG. 2 schematically shows a Reed-Solomon decoder.

In this specification, including the appended claims, the following quoted terms shall have the indicated meanings that are not limited to specific embodiments, except where expressly indicated otherwise:

"SIMD" is an initialism for "single instruction, multiple data" as known in the art. A "SIMD capable" computer processor has electrical circuitry for performing one or more SIMD operations.

The "base field" or "$\mathbb{F}_p$" is the finite field having p elements. In what follows, p=2 unless otherwise specified.

The "encoding field" or "$\mathbb{F}_q$" is the finite field having $q=p^s$ elements for some integer s≥1. As is known in the art, the field $\mathbb{F}_q$ may be constructed by adjoining, to the base field, any root of an irreducible polynomial of degree s whose coefficients are in the base field.

An "intermediate field" is a finite field having $p^r$ elements, where 1<r<s and r divides s. As is known in the art, intermediate fields exist for every such r.

A "Reed-Solomon code" or "RS code" with dimension k is the vector space $C_k \subset \mathbb{F}_q^n$ generated by the evaluation of the monomials $1, X, \ldots, X^{k-1}$ at the n=q−1 points of $\mathbb{F}_q \setminus \{0\}$. Namely, let α be a primitive element of $\mathbb{F}_q$ and let the "evaluation map" ev: $\mathbb{F}_q[X] \to \mathbb{F}_q^n$, be given by ev(f)=(f($\alpha^0$), f($\alpha^1$), ..., f($\alpha^{q-2}$)). Then the Reed Solomon code with dimension k is $C_k = \langle \{ev(X^i): i=0, \ldots, k-1\} \rangle$. Reed-Solomon codes are maximum distance separable ("MDS") codes, as that phrase is known in the art.

A "fragment" is a collection of one or more symbols defined over an encoding field.

A "data fragment" is a fragment of data.

An "encoded fragment" is a collection of one or more symbols encoding a data fragment according to an MDS code.

A "generator matrix" for an RS code with dimension k is an n×k matrix $G_k^v$ that, when multiplied (on the right) by a k-tuple data fragment, produces an n-tuple encoded fragment that encodes the data fragment. Since the evaluation map ev is injective, a Vandermonde generator matrix as known in the art is obtained by considering as columns the evaluation of the monomials at $\mathbb{F}_q\setminus\{0\}$:

$$G_k^v = (\alpha^{(i-1)(j-1)})_{1\leq i\leq n, 1\leq j\leq k}.$$

A row in $G_k^v$ provides the coefficients for generating an encoded fragment, while a column is associated to the contribution of an original fragment to the different coded fragments generated.

The elements of the above matrix $G_k^v$ are in $\mathbb{F}_q$, and in prior art (binary) code designs only the first column has all elements in $\mathbb{F}_2$. Embodiments of the present disclosure provide a different generator matrix for the Reed-Solomon code $C_k$ such that as many columns as possible have all elements in $\mathbb{F}_2$ (that is, they consist in zeroes and ones). It is appreciated that the concepts, techniques, and structures disclosed herein may be extended to base fields other than $\mathbb{F}_2$ in a routine manner.

To obtain a different generator matrix for the same code, we evaluate a set of polynomials, rather than monomials. In particular, we evaluate linearly independent polynomials of degree lower than k. We consider polynomials that evaluate to $\mathbb{F}_2$, i.e., $f \in \mathbb{F}_q[X]$ such that $ev(f) \in \mathbb{F}_2^n$, which polynomials are described by cyclotomic cosets and the trace of a polynomial. For an integer $0 \leq a < q-1$, consider the cyclotomic coset modulo q−1 defined by $I_a = \{a2^i \bmod q-1 : i=0,1,2,\ldots\}$. Theorem 1 below provides a basis for the polynomials evaluating to $\mathbb{F}_2$.

Theorem 1: A basis for the set of polynomials in $\mathbb{F}_q[X]$ evaluating to $\mathbb{F}_2$ is $$\bigcup_{I_a^{2^r}} \{f_{I_a^{2^r}, \beta^j} : j \in \{0, \ldots, \#I_a^{2^r} - 1\}\},$$

where $\beta = \alpha^{(2^s-1)/(2^{\eta_a}-1)}$, with $\eta_a = \# I_a$, i.e. a primitive element of $\mathbb{F}_{2^{\eta_a}} \subseteq \mathbb{F}_{2^s}$, and $f_{I_a,\beta} = \beta X^a + \beta^2 X^{2a} + \ldots + \beta^{2^{\eta_a-1}} X^{2^{\eta_a-1}a}$.

Consider $q=2^4$ as a toy example. The different cyclotomic cosets in $\mathbb{F}_q$ are $I_0=\{0\}$, $I_1=\{1,2,4,8\}$, $I_3=\{3,6,12,9\}$, $I_5=\{5,10\}$, and $I_7\{7,14,13,11\}$. One has that $I_1=I_2=I_4=I_8$ and so on. Some of the polynomials given by the previous theorem are as follows. One has a cyclotomic coset with one element $I_0=\{0\}$ and its associated polynomial is $1=X^0$, that trivially evaluates to $\mathbb{F}_2$. The polynomials associated to the cyclotomic coset $I_1=\{1,2,4,8\}$ are $\{f_{I_1,1}, f_{I_1,\alpha}, f_{I_1,\alpha^2}, f_{I_1,\alpha^3}\}$ respectively. They are linearly independent and evaluate to $\mathbb{F}_2$:

$$f_{I_1,1} = X + X^2 + X^4 + X^8$$

$$f_{I_1,\alpha} = \alpha X + \alpha^2 X^2 + \alpha^4 X^4 + \alpha^8 X^8$$

$$f_{I_1,\alpha^2} = \alpha^2 X + \alpha^4 X^2 + \alpha^8 X^4 + \alpha X^8$$

$$f_{I_1,\alpha^3} = \alpha^3 X + \alpha^6 X^2 + \alpha^{12} X^4 + \alpha^9 X^8.$$

For $I_5=\{5,10\}$, we have that $\{f_{I_5,1}, f_{I_5,\alpha^5}\}$ are its associated polynomials that evaluate to $\mathbb{F}_2$, since $\alpha^5 = \alpha^{((16-1)/(4-1))}$. Namely, $$f_{I_5,1} = X^5 + X^{10}$$

$$f_{I_5,\alpha^5} = \alpha^5 X^5 + \alpha^{10} X^{10}.$$

Continuing this way, we get from $I_3$ four polynomials of degree 12, as $I_3=\{3,6,9,12\}$, and from $I_7$, another four polynomials of degree 14, as $I_7=\{7,11,13,14\}$, all of which evaluate to $\mathbb{F}_2$.

With these polynomials, we can construct the Reed-Solomon code $C_9$ with dimension 9 and length 15 over $\mathbb{F}_{16}$. By Theorem 1, evaluate $f_{I_1,1}, f_{I_1,\alpha}, f_{I_1,\alpha^2}, f_{I_1,\alpha^3}$ instead of $X$, $X^2$, $X^4$, $X^8$ to construct the generator matrix, since $\{1,2,4,8\} \subset \{0,\ldots,8\}$. In this way, a generator matrix of the Reed-Solomon code $C_9$ consists of the columns ev(1), ev$(f_{I_1,1})$, ev$(f_{I_1,\alpha})$, ev$(f_{I_1,\alpha^2})$, ev$(f_{I_1,\alpha^3})$, ev$(X^3)$, ev$(X^5)$, ev$(X^6)$ and ev$(X^7)$. Note that these polynomials will evaluate to codewords that are linearly independent since some of them have different degree and the ones with the same degree are linearly independent from each other by Theorem 1, and linearly independent from the remaining polynomials by the definition of $f_{I_a,\alpha^i}$. The elements of the first 5 columns of the generator matrix below are in $\mathbb{F}_2$.

$$G_9 = \begin{bmatrix} 1 & 0 & 0 & 0 & 1 & 1 & 1 & 1 & 1 \\ 1 & 0 & 0 & 1 & 0 & \alpha^3 & \alpha^5 & \alpha^6 & \alpha^7 \\ 1 & 0 & 1 & 0 & 0 & \alpha^6 & \alpha^{10} & \alpha^{12} & \alpha^{14} \\ 1 & 1 & 0 & 0 & 1 & \alpha^9 & 1 & \alpha^3 & \alpha^6 \\ 1 & 0 & 0 & 1 & 1 & \alpha^{12} & \alpha^5 & \alpha^9 & \alpha^{13} \\ 1 & 0 & 1 & 1 & 0 & 1 & \alpha^{10} & 1 & \alpha^5 \\ 1 & 1 & 1 & 0 & 1 & \alpha^3 & 1 & \alpha^6 & \alpha^{12} \\ 1 & 1 & 0 & 1 & 0 & \alpha^6 & \alpha^5 & \alpha^{12} & \alpha^4 \\ 1 & 0 & 1 & 0 & 1 & \alpha^9 & \alpha^{10} & \alpha^3 & \alpha^{11} \\ 1 & 1 & 0 & 1 & 1 & \alpha^{12} & 1 & \alpha^9 & \alpha^3 \\ 1 & 0 & 1 & 1 & 1 & 1 & \alpha^5 & 1 & \alpha^{10} \\ 1 & 1 & 1 & 1 & 1 & \alpha^3 & \alpha^{10} & \alpha^6 & \alpha^2 \\ 1 & 1 & 1 & 1 & 0 & \alpha^6 & 1 & \alpha^{12} & \alpha^9 \\ 1 & 1 & 1 & 0 & 0 & \alpha^9 & \alpha^5 & \alpha^3 & \alpha \\ 1 & 1 & 0 & 0 & 0 & \alpha^{12} & \alpha^9 & \alpha^6 & \alpha^8 \end{bmatrix}$$

As another example, let $C_{11}$ be the Reed-Solomon code with dimension 11 and length 15 over $\mathbb{F}_{16}$. The generator matrix of this code can be obtained by considering $\{ev(X^i): i=0,\ldots,10\}$. As before, by Theorem 1, we can consider $f_{I_1,1}, f_{I_1,\alpha}, f_{I_1,\alpha^2}, f_{I_1,\alpha^3}$ instead of $X, X^2, X^4, X^8$ since $\{1,2,4,8\} \subset \{0,\ldots,10\}$. Furthermore, we can now consider $f_{I_5,1}, f_{I_5,\alpha^5}$ instead of $X^5, X^{10}$. In this way, by the same reason as before, a generator matrix of the Reed-Solomon code $C_{11}$ is given by ev(1), ev$(f_{I_1,1})$, ev$(f_{I_1,\alpha})$, ev$(f_{I_1,\alpha^2})$, ev$(f_{I_1,\alpha^3})$, ev$(f_{I_5,1})$, ev$(f_{I_5,\alpha^5})$, ev$(X^3)$, ev$(X^6)$, ev$(X^7)$, ev$(X^9)$. The elements of the first 7 columns of the generator matrix are in $\mathbb{F}_2$, with the first five and last four columns the same as before.

$$G_{11} = \begin{bmatrix} 1 & 0 & 0 & 0 & 1 & 0 & 1 & 1 & 1 & 1 & 1 \\ 1 & 0 & 0 & 1 & 0 & 1 & 1 & \alpha^3 & \alpha^6 & \alpha^7 & \alpha^9 \\ 1 & 0 & 1 & 0 & 0 & 1 & 0 & \alpha^6 & \alpha^{12} & \alpha^{14} & \alpha^3 \\ 1 & 1 & 0 & 0 & 1 & 0 & 1 & \alpha^9 & \alpha^3 & \alpha^6 & \alpha^{12} \\ 1 & 0 & 0 & 1 & 1 & 1 & 1 & \alpha^{12} & \alpha^9 & \alpha^{13} & \alpha^6 \\ 1 & 0 & 1 & 1 & 0 & 1 & 0 & 1 & 1 & \alpha^5 & 1 \\ 1 & 1 & 1 & 0 & 1 & 0 & 1 & \alpha^3 & \alpha^6 & \alpha^{12} & \alpha^9 \\ 1 & 1 & 0 & 1 & 0 & 1 & 1 & \alpha^6 & \alpha^{12} & \alpha^4 & \alpha^3 \\ 1 & 0 & 1 & 0 & 1 & 1 & 0 & \alpha^9 & \alpha^3 & \alpha^{11} & \alpha^{12} \\ 1 & 1 & 0 & 1 & 1 & 0 & 1 & \alpha^{12} & \alpha^9 & \alpha^3 & \alpha^6 \\ 1 & 0 & 1 & 1 & 1 & 1 & 1 & 1 & 1 & \alpha^{10} & 1 \\ 1 & 1 & 1 & 1 & 1 & 1 & 0 & \alpha^3 & \alpha^6 & \alpha^2 & \alpha^9 \\ 1 & 1 & 1 & 1 & 0 & 0 & 1 & \alpha^6 & \alpha^{12} & \alpha^9 & \alpha^3 \\ 1 & 1 & 1 & 0 & 0 & 1 & 1 & \alpha^9 & \alpha^3 & \alpha & \alpha^{12} \\ 1 & 1 & 0 & 0 & 0 & 1 & 0 & \alpha^{12} & \alpha^9 & \alpha^8 & \alpha^6 \end{bmatrix}$$

Analogously, for the Reed-Solomon code $C_{13}$ with dimension 13 and length 15 over $\mathbb{F}_{16}$, we can construct a generator matrix with 11 columns with all elements in $\mathbb{F}_2$. In general, for a Reed-Solomon code $C_k$ with dimension k over $\mathbb{F}_q$, by applying these concepts, structures, and techniques one can obtain a generator matrix with $$\sum_{I_a \subseteq \{0,\ldots,k-1\}} \# I_a$$

columns in $\mathbb{F}_2$. Note that, by Theorem 1, such a number of columns is optimal. For Reed-Solomon codes over $\mathbb{F}_{16}$, Table 1 below summarizes how many columns can be obtained in $\mathbb{F}_2$.

TABLE 1

Optimal number of columns in $\mathbb{F}_2$ for various k for RS codes over $\mathbb{F}_{16}$

| | Dimension k | | | | | | | | | | | | | | |
|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 |
| #Columns in $\mathbb{F}_2$ | 1 | 1 | 1 | 1 | 1 | 1 | 1 | 1 | 5 | 5 | 7 | 7 | 11 | 11 | 15 |

We have described how to construct a generator matrix by evaluating the polynomials given in Theorem 1. Alternatively, one can perform elementary operations in the Vandermonde matrix $G_k^v$: let $g_i$ be the column i of the matrix $G_k^v$, for $i=1, \ldots, k$. The polynomial $f_{I_a,\beta} = \beta X^a + \beta^2 X^{2a} + \ldots + \beta^{2^{\#I_a-1}} I_{a-1^a}$ indicates that the column i of the matrix $G_k$ is given by a linear combination of columns of $G_k^v$:

$$\sum_{j=0}^{\#I_a-1} \beta^{2^j} g_{2^j i_{a+1} \bmod q-1}.$$

Figure 3:
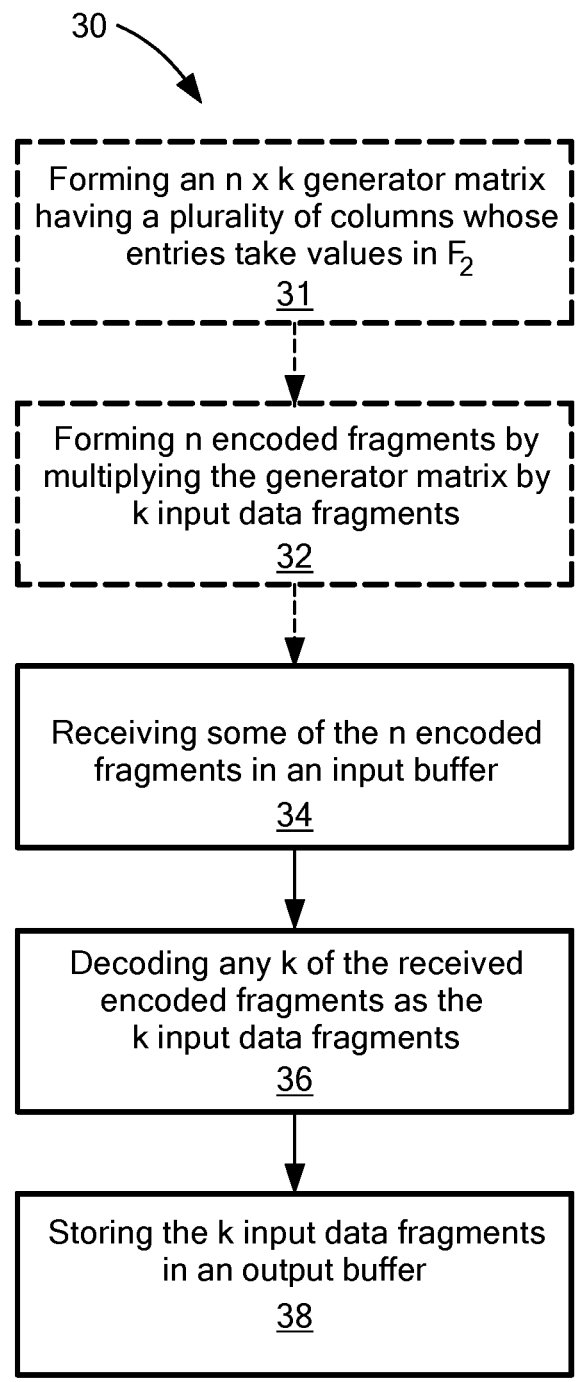
FIG. 3 is a flow diagram for a method of decoding according to an embodiment.

Applying these concepts, structures, and techniques to a practical encoder-decoder system, FIG. 3 is a flow diagram for a method 30 of decoding according to an embodiment. For ease of understanding, encoding processes 31 and 32 are shown by dashed elements, but form no part of the method 30 of decoding that properly includes only processes 34, 36, and 38 shown by solid elements. Thus, it is appreciated that the encoding processes occur before the decoding processes.

The first encoding process 31 involves forming an n×k generator matrix according to the concepts, structures, and techniques described above, that stands in place of generator matrix 16. Thus, unlike the prior art, the generator matrix according to embodiments has a plurality of columns whose entries take values in $\mathbb{F}_2$. The second encoding process 32 involves forming n encoded fragments by multiplying the generator matrix by k input data fragments. The process 32 may be performed, for example, by encoding circuitry 14 or by some other, similar hardware or software. It is appreciated that, while not properly part of the decoding method 30, these encoding processes 31 and 32 advantageously are made more computationally efficient due to the use of the special generator matrix. The n encoded fragments may be stored in a storage arrangement, for example in one or more storage devices. To increase resilience against data loss and permit recovery following hardware or software failure in the storage arrangement, different encoded fragments may be stored on different storage devices.

The first decoding process 34 of the method 30 involves receiving at least some of the n encoded fragments in an input buffer, such as input buffer 22. In accordance with erasure-correcting embodiments, at least k of the encoded fragments are received.

The second decoding process 36 of the method 30 involves decoding the received encoded fragments. Such decoding may include, for example, correcting erasures by performing Gaussian elimination on the received encoded fragments, or other operations known in the prior art of decoding Reed-Solomon codes. The decoding process 36 may be performed, for example, by pre-existing decoding circuitry 24, or by some other, similar hardware or software. Advantageously, embodiments may cooperate with encoder-decoder systems without the need for reprogramming pre-existing encoding circuitry 14 or decoding circuitry 24; rather, only the generator matrix 16 and decoder matrix 26 need to be updated, and these matrices may be stored in programmable read-only memory. The third decoding process 38 includes storing the recovered k input data fragments in an output buffer, for subsequent use by the data consumer.

To test the potential benefits of this approach, we used the kodo C++ library by Steinwurf ApS of Aalborg, Denmark in order to implement and measure performance of both RS Vandermonde and RS Cauchy decoding on two different finite fields, and our new constructions with two finite fields. We also used the longhair and leopard libraries by Christopher A. Taylor to compare our performance against an RS Cauchy optimized implementation (SIMD capable) and an FFT-based RS implementation, respectively. For a fair comparison, we considered non-systematic codes; that is, codes in which the data fragment being encoded does not appear verbatim as part of the encoded fragment. This means that the RS Cauchy decoding tests were considered using only encoded packets, which limited the generation size to 128 packets. The performance evaluation was carried out on an OSX machine (2015) with a 2.2 GHz Intel Core i7 processor with single instruction, multiple data (SIMD) support. Specifically, the CPU provided SSSE3, SSSE4, and AVX2 support, which was used to perform hardware acceleration of finite field operations. We measured the decoding speed of both approaches using the same decoding algorithm in order to compare fairly. However, improved algorithms for our construction can be developed due to the problem's structure.

Figure 4:
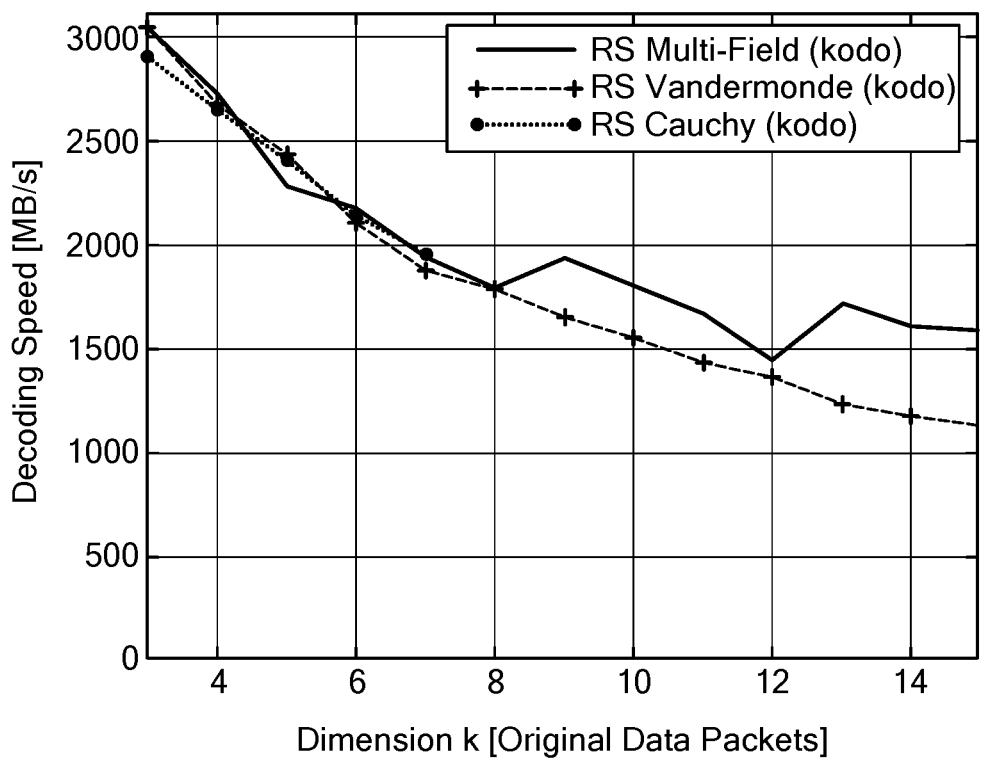
FIG. 4 shows measured performance of a multi-field decoding embodiment along with performances of prior art Reed-Solomon decoders using Vandermonde and Cauchy generator matrices for the encoding field having 16 elements.

FIG. 4 shows the performance of our approach when using a combination of finite fields $\mathbb{F}_2$ and $\mathbb{F}_{2^4}$ compared to a RS Cauchy code and RS Vandermonde code using $\mathbb{F}_{2^4}$. Unfortunately, longhair and leopard did not provide support for this encoding field. As expected, the performance difference between RS Vandermonde and our proposed code started when the number of original packets (i.e., code dimension) was $k \geq q/2+1=2^4/2+1=9$, where q is the size of the larger, encoding field. Our results show that gains of up to 37% are attainable by implementing the concepts, structures, and techniques described above. Note that the RS Cauchy implementation performed similarly to RS Vandermonde, due to the use of similar SIMD instructions for the product operations. FIG. 4 also shows that the decoding speed for a generation size (dimension) of $k \geq 12$ is kept above 1440 MB/s with our approach, while the standard Vandermonde RS approach continues to decrease in decoding speed for the same region. This observation is related to the increased number of 1 and 0 coefficients introduced in accordance with generator matrices in the disclosed embodiments.

Figure 5:
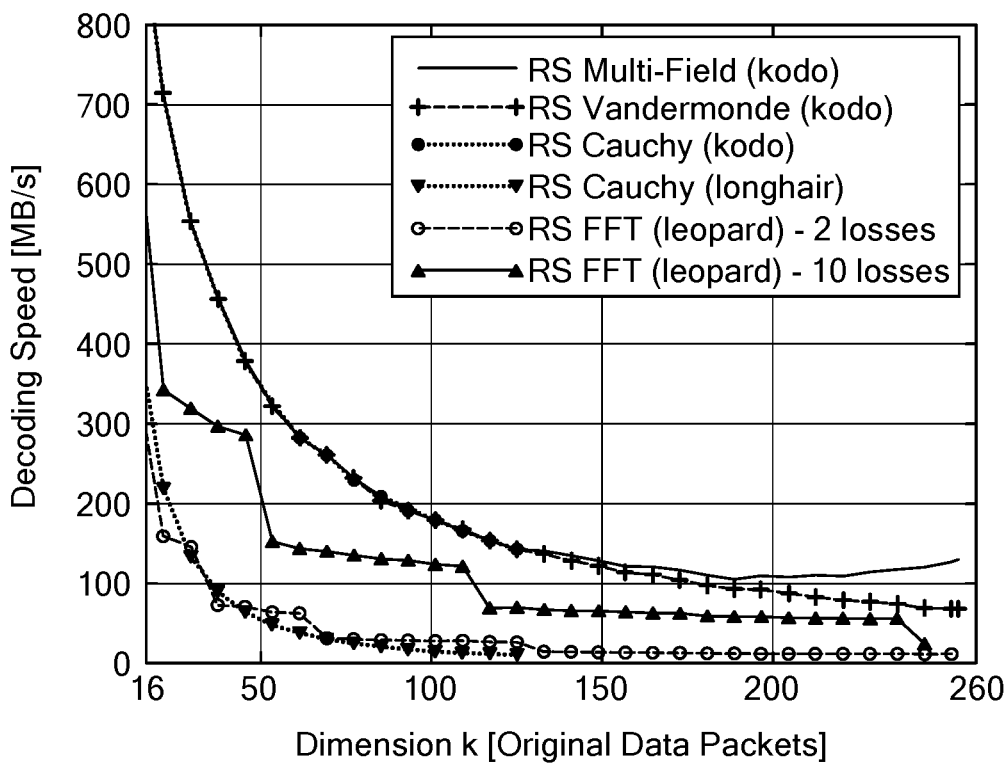
FIG. 5 shows measured performance of a multi-field decoding embodiment along with performances of prior art Reed-Solomon decoders using Vandermonde and Cauchy generator matrices for the encoding field having 256 elements.

FIG. 5 shows the performance of our approach when using a combination of finite fields $\mathbb{F}_2$ and $\mathbb{F}_{2^8}$, similar to FIG. 4. In this case, a dimension $k \geq q/2+1=256/2+1=129$ is necessary to see differences between our scheme and RS. In this case, we compared to RS Vandermonde and Cauchy implementations from kodo, but also longhair's Cauchy implementation and leopard's FFT-based RS decoder. Our results show not only that the decoding speed of our approach can be almost twice as high as RS Cauchy or Vandermonde from kodo and larger than the other schemes, but also that the decoding speed increases when k>200. The latter means that the decoding speed is predictably never worse than 100 MB/s for this particular device using our approach, which provides some system design advantages at the time of planning and allocating resources for decoding purposes, which may rely on worst case performance of the decoder.

The results for the RS Vandermonde and Cauchy implementations and for disclosed embodiments are not dependent on the loss patterns. However, FIG. 5 shows that leopard's decoder depends heavily on the generated redundancy and losses, e.g., there is a performance gap of five times between the performance for two losses and ten losses, with the former being slower. This makes the performance of the FFT-based RS less predictable than the other schemes, with worst case scenarios being an order of magnitude slower than other schemes. The fact that the performance is lower when fewer losses occur may limit its use in some applications, e.g. distributed storage, where the system is likely to repair damaged fragments after a few losses.

As an important remark, these results were obtained for a computer that exploits hardware acceleration (SIMD instructions). As is known in the art, the gap between a hardware-accelerated implementation and an implementation without it is an order of magnitude. This means that the gains are expected to be much larger in devices without these capabilities, e.g. lower end smart phones and IoT devices, as the cost of processing large fields is significantly higher without SIMD functionalities with respect to processing smaller finite fields.

Above, we discussed generator matrices for Reed-Solomon codes with as many columns with all elements in $\mathbb{F}_2$ as possible. However, one may modify the approach to construct generator matrices where some of the columns, that do not have all elements in $\mathbb{F}_2$, have all their elements in an intermediate field $\mathbb{F}_{2^r}$ with r|s, since $\mathbb{F}_2 \subset \mathbb{F}_{2^r} \subset \mathbb{F}_{2^s}$. This modification allows encoders and decoders to operate in an intermediate field that is faster than the largest field, thus increasing further the encoding and decoding speeds in the system. Thus, consider now $2^r$-cyclotomic cosets modulo $2^s-1$ (that is, the cosets $I_a^{2^r}=\{a2^{ri} \mod 2^s-1 : i=0,1,2,\ldots\}$), and rewrite Theorem 1 as follows.

Theorem 2. A basis for the set of polynomials in $\mathbb{F}_q[X]$ evaluating to $\mathbb{F}_{2^r}$, with r|s, is $$\bigcup_{I_a^{2^r}} \{f_{I_a^{2^r},\beta^j} : j \in \{0, \ldots, \#I_a^{2^r}-1\}\},$$

where $\beta = \alpha^{(2^s-1)/(2^{\eta_a}-1)}$, with $\eta_a = \# I_a^{2^r}$, i.e. a primitive element of $\mathbb{F}_{2^{\eta_a}} \subseteq \mathbb{F}_{2^s}$, and $f_{I_a^{2^r},\beta} = \beta X^a + \beta^{2^r} X^{2^r a} + \ldots + \beta^{2^{\eta_a-1}} X^{2^{\eta_a-1}a}$.

For example, with $q=2^4$ we have that $\mathbb{F}_2 \subset \mathbb{F}_4 \subset \mathbb{F}_{16}$. The 4-cyclotomic cosets are $I_0^4=\{0\}$, $I_1^4=\{1,4\}$, $I_2^4=\{2,8\}$, $I_3^4=\{3,12\}$, $I_5^4=\{5,10\}$, $I_6^4=\{6,9\}$, $I_7^4=\{7,13\}$, and $I_{11}^4=\{11,14\}$. Using Theorem 2, one can obtain generator matrices for Reed-Solomon codes with the following number of columns in $\mathbb{F}_2^n$ and $\mathbb{F}_4^n \dagger \mathbb{F}_2^n$, as in Table 2 below.

TTABLE 2

Optimal number of columns in $\mathbb{F}_2$ and $\mathbb{F}_4$ for various k for RS codes over $\mathbb{F}_{16}$

| | Dimension k | | | | | | | | | | | | | | |
|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 |
| #Cols. in $\mathbb{F}_2^n$ | 1 | 1 | 1 | 1 | 1 | 1 | 1 | 1 | 5 | 5 | 7 | 7 | 11 | 11 | 15 |
| #Cols. in $\mathbb{F}_4^n \backslash \mathbb{F}_2^n$ | 0 | 0 | 0 | 0 | 2 | 2 | 2 | 2 | 0 | 2 | 2 | 2 | 0 | 2 | 0 |

Figure 6:
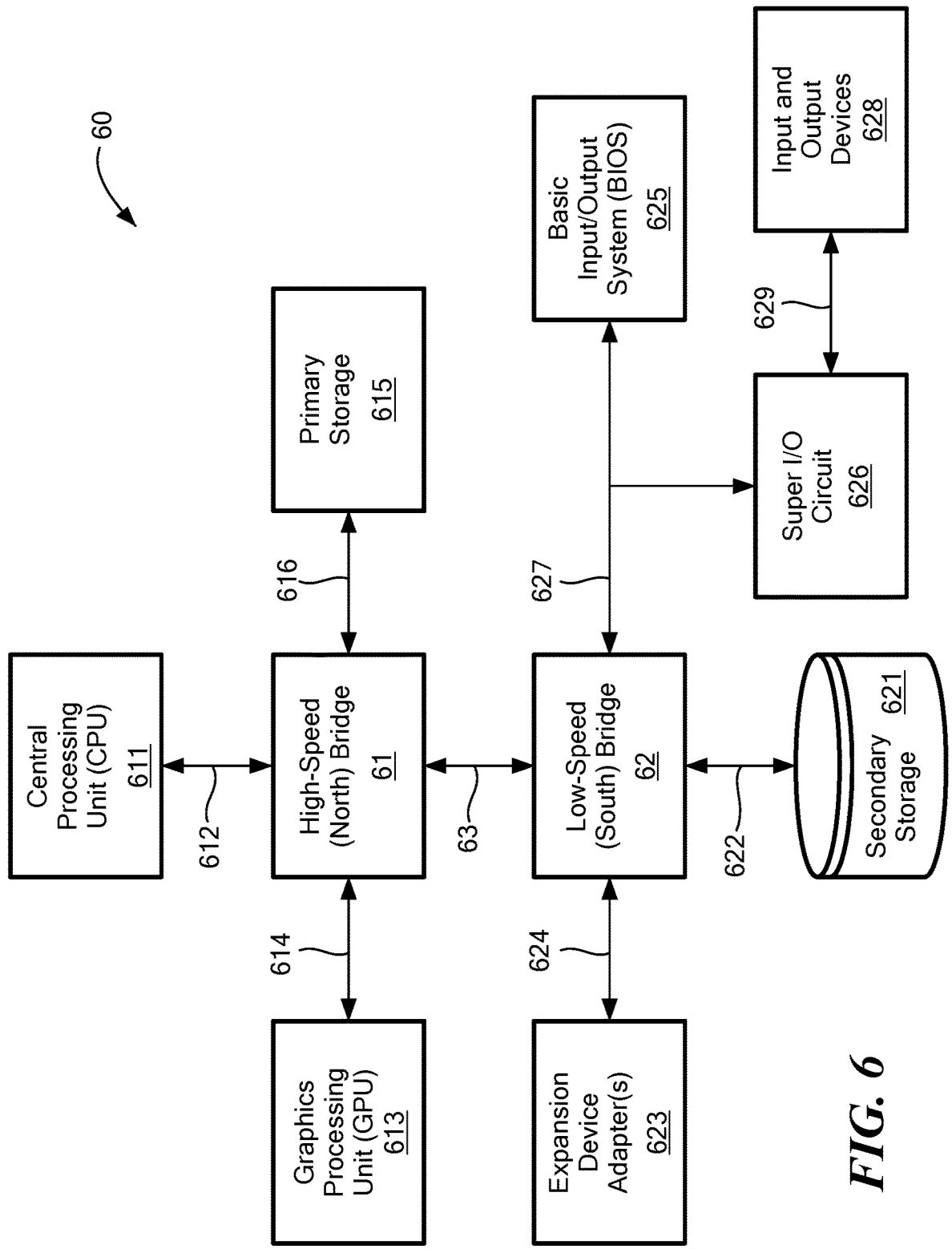
FIG. 6 schematically shows relevant physical components of a computer processing system embodiment, and their respective relationships.

FIG. 6 schematically shows relevant physical components of a computer processing system 60 embodiment, and their respective relationships. The encoder 10 or decoder 20 may be embodied as such a computer 60, or as a portion thereof. Generally, the computer 60 has many functional components that communicate data with each other using data buses. The functional components of FIG. 6 are physically arranged based on the speed at which each must operate, and the technology used to communicate data using buses at the necessary speeds to permit such operation.

Thus, the computer 60 is arranged as high-speed components and buses 611-616 and low-speed components and buses 621-629. The high-speed components and buses 611-616 are coupled for data communication using a high-speed bridge 61, also called a "northbridge," while the low-speed components and buses 621-629 are coupled using a low-speed bridge 62, also called a "southbridge."

The computer 60 includes a central processing unit ("CPU") 611 coupled to the high-speed bridge 61 via a bus 612. The CPU 611 is electronic circuitry that carries out the instructions of a computer program. As is known in the art, the CPU 611 may be implemented as a microprocessor; that is, as an integrated circuit ("IC"; also called a "chip" or "microchip"). In some embodiments, the CPU 611 may be implemented as a microcontroller for embedded applications, or according to other embodiments known in the art.

The bus 612 may be implemented using any technology known in the art for interconnection of CPUs (or more particularly, of microprocessors). For example, the bus 612 may be implemented using the HyperTransport architecture developed initially by AMD, the Intel QuickPath Interconnect ("QPI"), or a similar technology. In some embodiments, the functions of the high-speed bridge 61 may be implemented in whole or in part by the CPU 611, obviating the need for the bus 612.

The computer 60 includes one or more graphics processing units (GPUs) 613 coupled to the high-speed bridge 61 via a graphics bus 614. Each GPU 613 is designed to process commands from the CPU 611 into image data for display on a display screen (not shown). In some embodiments, the CPU 611 performs graphics processing directly, obviating the need for a separate GPU 613 and graphics bus 614. In other embodiments, a GPU 613 is physically embodied as an integrated circuit separate from the CPU 611 and may be physically detachable from the computer 60 if embodied on an expansion card, such as a video card. The GPU 613 may store image data (or other data, if the GPU 613 is used as an auxiliary computing processor) in a graphics buffer.

The graphics bus 614 may be implemented using any technology known in the art for data communication between a CPU and a GPU. For example, the graphics bus 614 may be implemented using the Peripheral Component Interconnect Express ("PCI Express" or "PCIe") standard, or a similar technology.

The computer 60 includes a primary storage 615 coupled to the high-speed bridge 61 via a memory bus 616. The primary storage 615, which may be called "main memory" or simply "memory" herein, includes computer program instructions, data, or both, for use by the CPU 611. The primary storage 615 may include random-access memory ("RAM"). RAM is "volatile" if its data are lost when power is removed, and "non-volatile" if its data are retained without applied power. Typically, volatile RAM is used when the computer 60 is "awake" and executing a program, and when the computer 60 is temporarily "asleep", while non-volatile RAM ("NVRAM") is used when the computer 60 is "hibernating"; however, embodiments may vary. Volatile RAM may be, for example, dynamic ("DRAM"), synchronous ("SDRAM"), and double-data rate ("DDR SDRAM"). Non-volatile RAM may be, for example, solid-state flash memory. RAM may be physically provided as one or more dual in-line memory modules ("DIMMs"), or other, similar technology known in the art.

The memory bus 616 may be implemented using any technology known in the art for data communication between a CPU and a primary storage. The memory bus 616 may comprise an address bus for electrically indicating a storage address, and a data bus for transmitting program instructions and data to, and receiving them from, the primary storage 615. For example, if data are stored and retrieved 64 bits (eight bytes) at a time, then the data bus has a width of 64 bits. Continuing this example, if the address bus has a width of 32 bits, then $2^{32}$ memory addresses are accessible, so the computer 60 may use up to $8*2^{32}=32$ gigabytes (GB) of primary storage 615. In this example, the memory bus 616 will have a total width of 64+32=96 bits. The computer 60 also may include a memory controller circuit (not shown) that converts electrical signals received from the memory bus 616 to electrical signals expected by physical pins in the primary storage 615, and vice versa.

Computer memory may be hierarchically organized based on a tradeoff between memory response time and memory size, so depictions and references herein to types of memory as being in certain physical locations are for illustration only. Thus, some embodiments (e.g. embedded systems) provide the CPU 611, the graphics processing units 613, the primary storage 615, and the high-speed bridge 61, or any combination thereof, as a single integrated circuit. In such embodiments, buses 612, 614, 616 may form part of the same integrated circuit and need not be physically separate. Other designs for the computer 60 may embody the functions of the CPU 611, graphics processing units 613, and the primary storage 615 in different configurations, obviating the need for one or more of the buses 612, 614, 616.

The depiction of the high-speed bridge 61 coupled to the CPU 611, GPU 613, and primary storage 615 is merely exemplary, as other components may be coupled for communication with the high-speed bridge 61. For example, a network interface controller ("NIC" or "network adapter") may be coupled to the high-speed bridge 61, for transmitting and receiving data using a data channel, such as data channel 16. The NIC may store data to be transmitted to, and received from, the data channel 16 in a network data buffer.

The high-speed bridge 61 is coupled for data communication with the low-speed bridge 62 using an internal data bus 63. Control circuitry (not shown) may be required for transmitting and receiving data at different speeds. The internal data bus 63 may be implemented using the Intel Direct Media Interface ("DMI") or a similar technology.

The computer 60 includes a secondary storage 621 coupled to the low-speed bridge 62 via a storage bus 622. The secondary storage 621, which may be called "auxiliary memory", "auxiliary storage", or "external memory" herein, stores program instructions and data for access at relatively low speeds and over relatively long durations. Since such durations may include removal of power from the computer 60, the secondary storage 621 may include non-volatile memory (which may or may not be randomly accessible).

Non-volatile memory may comprise solid-state memory having no moving parts, for example a flash drive or solid-state drive. Alternately, non-volatile memory may comprise a moving disc or tape for storing data and an apparatus for reading (and possibly writing) the data. Data may be stored (and possibly rewritten) optically, for example on a compact disc ("CD"), digital video disc ("DVD"), or Blu-ray disc ("BD"), or magnetically, for example on a disc in a hard disk drive ("HDD") or a floppy disk, or on a digital audio tape ("DAT"). Non-volatile memory may be, for example, read-only ("ROM"), write-once read-many ("WORM"), programmable ("PROM"), erasable ("EPROM"), or electrically erasable ("EEPROM").

The storage bus 622 may be implemented using any technology known in the art for data communication between a CPU and a secondary storage and may include a host adaptor (not shown) for adapting electrical signals from the low-speed bridge 62 to a format expected by physical pins on the secondary storage 621, and vice versa. For example, the storage bus 622 may use a Universal Serial Bus ("USB") standard; a Serial AT Attachment ("SATA") standard; a Parallel AT Attachment ("PATA") standard such as Integrated Drive Electronics ("IDE"), Enhanced IDE ("EIDE"), ATA Packet Interface ("ATAPI"), or Ultra ATA; a Small Computer System Interface ("SCSI") standard; or a similar technology.

The computer 60 also includes one or more expansion device adapters 623 coupled to the low-speed bridge 62 via a respective one or more expansion buses 624. Each expansion device adapter 623 permits the computer 60 to communicate with expansion devices (not shown) that provide additional functionality. Such additional functionality may be provided on a separate, removable expansion card, for example an additional graphics card, network card, host adaptor, or specialized processing card.

Each expansion bus 624 may be implemented using any technology known in the art for data communication between a CPU and an expansion device adapter. For example, the expansion bus 624 may transmit and receive electrical signals using a Peripheral Component Interconnect ("PCI") standard, a data networking standard such as an Ethernet standard, or a similar technology.

The computer 60 includes a basic input/output system (BIOS) 625 and a Super I/O circuit 626 coupled to the low-speed bridge 62 via a bus 627. The BIOS 625 is a non-volatile memory used to initialize the hardware of the computer 60 during the power-on process. The Super I/O circuit 626 is an integrated circuit that combines input and output ("I/O") interfaces for low-speed input and output devices 628, such as a serial mouse and a keyboard. In some embodiments, BIOS functionality is incorporated in the Super I/O circuit 626 directly, obviating the need for a separate BIOS 625.

The bus 627 may be implemented using any technology known in the art for data communication between a CPU, a BIOS (if present), and a Super I/O circuit. For example, the bus 627 may be implemented using a Low Pin Count ("LPC") bus, an Industry Standard Architecture ("ISA") bus, or similar technology. The Super I/O circuit 626 is coupled to the I/O devices 628 via one or more buses 629. The buses 629 may be serial buses, parallel buses, other buses known in the art, or a combination of these, depending on the type of I/O devices 628 coupled to the computer 60 . . . .

The techniques and structures described herein may be implemented in any of a variety of different forms. For example, features in accordance with the concepts, structures, and techniques disclosed herein may be embodied in various forms of communication devices, both wired and wireless; television sets; set top boxes; audio/video devices; laptop, palmtop, desktop, and tablet computers with or without wireless capability; personal digital assistants (PDAs); telephones; pagers; satellite communicators; cameras having communication capability; network interface cards (NICs) and other network interface structures; base stations; access points; integrated circuits; as instructions and/or data structures stored on machine readable media; and/or in other formats. Examples of different types of machine readable media that may be used include floppy diskettes, hard disks, optical disks, compact disc read only memories (CD-ROMs), digital video disks (DVDs), Blu-ray disks, magneto-optical disks, read only memories (ROMs), random access memories (RAMs), erasable programmable ROMs (EPROMs), electrically erasable programmable ROMs (EEPROMs), magnetic or optical cards, flash memory, and/or other types of media suitable for storing electronic instructions or data.

In the foregoing detailed description, various features in accordance with the concepts, structures, and techniques disclosed herein are grouped together in one or more individual embodiments for the purpose of streamlining the disclosure. This method of disclosure is not to be interpreted as reflecting an intention that the claimed invention requires more features than are expressly recited in each claim. Rather, inventive aspects may lie in less than all features of each disclosed embodiment.

Having described implementations which serve to illustrate various concepts, structures, and techniques which are the subject of this disclosure, it will now become apparent to those of ordinary skill in the art that other implementations incorporating these concepts, structures, and techniques may be used. Accordingly, it is submitted that that scope of the patent should not be limited to the described implementations but rather should be limited only by the spirit and scope of the following claims.

What is claimed is:

1. Apparatus for decoding data according to a maximum distance separable (MDS) code defined over an encoding field having $2^s>2$ elements, the apparatus comprising:
   an input buffer configured for receiving a plurality of encoded fragments that were formed by multiplying a plurality of k data fragments by an n×k generator matrix for the MDS code, wherein each data fragment and the generator matrix comprise data symbols in the encoding field, and wherein the generator matrix has a plurality of columns whose entries each take values in the finite field having two elements, wherein the generator matrix is formed by evaluating a set of linearly independent polynomials in the encoding field having $2^s$ elements that evaluate to the finite field having two elements;
   decoding circuitry configured for decoding any k received encoded fragments as the k data fragments; and
   an output buffer configured for storing the k data fragments following decoding.

2. The apparatus of claim 1, further comprising a storage arrangement configured for storing the plurality of encoded fragments.

3. The apparatus of claim 2, wherein the input buffer is configured for receiving, from the storage arrangement, less than all of the plurality of the encoded fragments due to an erasure in the storage arrangement.

4. The apparatus of claim 2, wherein the storage arrangement comprises a plurality of storage devices, and wherein the storage arrangement is configured for storing at least two encoded fragments on different storage devices.

5. The apparatus of claim 1, wherein the decoding circuitry is configured for performing Gaussian elimination on the received encoded fragments.

6. The apparatus of claim 1, wherein the decoding circuitry comprises a computer processor.

7. The apparatus of claim 6, wherein the computer processor lacks circuitry for performing single instruction, multiple data (SIMD) operations.

8. The apparatus of claim 1, wherein the generator matrix has a column whose entries each take values in an intermediate field having a number of elements $2^r$ greater than 2 and less than $2^s$.

9. The apparatus of claim 8, wherein the generator matrix has a column whose entries each take values in a second intermediate field having a number of elements $2^{r_2}$ greater than $2^r$ and less than $2^s$.

10. Method of decoding data according to a maximum distance separable (MDS) code defined over an encoding field having $2^s>2$ elements, the method comprising:
receiving, in an input buffer, a plurality of encoded fragments that were formed by multiplying a plurality of k data fragments by an n×k generator matrix for the MDS code, wherein each data fragment and the generator matrix comprise data symbols in the encoding field, and wherein the generator matrix has a plurality of columns whose entries each take values in the finite field having two elements, wherein the generator matrix is formed by evaluating a set of linearly independent polynomials in the encoding field having $2^s$ elements that evaluate to the finite field having two elements;
decoding, by decoding circuitry, any k received encoded fragments as the k data fragments; and
storing, by an output buffer, the k data fragments following decoding.

11. The method of claim 10, wherein receiving comprises receiving, from a storage arrangement, less than all of the plurality of the encoded fragments due to an erasure in the storage arrangement.

12. The method of claim 10, wherein decoding comprises performing Gaussian elimination on the received encoded fragments.

13. The method of claim 10, wherein decoding comprises decoding without using single instruction, multiple data (SIMD) operations.

14. The method of claim 10, wherein the generator matrix has a column whose entries each take values in an intermediate field having a number of elements $2^r$ greater than 2 and less than $2^s$.

15. The method of claim 14, wherein the generator matrix has a column whose entries each take values in a second intermediate field having a number of elements $2^{r_2}$ greater than $2^r$ and less than $2^s$.

* * * * *